United States Patent [19]

Nakamura et al.

[11] Patent Number: 5,168,509
[45] Date of Patent: Dec. 1, 1992

[54] QUADRATURE AMPLITUDE MODULATION COMMUNICATION SYSTEM WITH TRANSPARENT ERROR CORRECTION

[75] Inventors: Makoto Nakamura, Kanagawa; Tomoko Kodama, Yokohama, both of Japan

[73] Assignee: Kabushiki Kaisha Toshiba, Kawasaki, Japan

[21] Appl. No.: 507,303

[22] Filed: Apr. 10, 1990

[30] Foreign Application Priority Data

Apr. 12, 1989 [JP] Japan .................................. 1-90623
Apr. 28, 1989 [JP] Japan .................................. 1-111622

[51] Int. Cl.⁵ .......................................... H04L 05/12
[52] U.S. Cl. ...................................... 375/39; 371/37.5
[58] Field of Search ................... 375/39, 27, 42, 27, 375/39, 42; 371/37.1, 37.5, 43

[56] References Cited

U.S. PATENT DOCUMENTS 4,553,237 11/1985 Nakamura ........................... 375/39

FOREIGN PATENT DOCUMENTS 0111349 9/1981 Japan .................................. 371/37.5
0219252 9/1988 Japan .................................. 375/39

OTHER PUBLICATIONS

IEEE Transactions on Communication Technology, vol. COM-19, No. 5, pp. 8212-8835, "A High-Speed Sequential Decoder: Prototype Design and Test", G. D. Forney, et al., Oct. 1971.
Proceedings of International Conference on Communications, pp. 1472-1477 (F2.4), "6GHz 135MBPS Digital Radio System With 64 QAM Modulation", T. Noguchi, et al., 1983.
Proceedings of International Conference on Communications, pp. 1482-1486 (46.7), "6GHZ 140MBPS Digital Radio Repeater With 256QAM Modulation", Y. Yoshida, et al., 1986.
Lin, et al., *Error Control Coding Fundamentals and Applications,* Prentice-Hall, Inc., N.J., 1983, pp. 34-39, $85 \geq 93$, 141-151, and 170-177.

*Primary Examiner*—Curtis Kuntz
*Assistant Examiner*—T. Ghebretinsae
*Attorney, Agent, or Firm*—Foley & Lardner

[57] ABSTRACT

In a multi-level QAM communication system, Reed-Solomon encoders and Reed-Solomon decoders are employed for error correction purposes. The phase ambiguity of the received signal is eliminated with differential coding. The multi-level QAM communication system utilizing n bits ("n" being an integer) QAM signal having $2^n$ signal points, comprises: a quadrature differential encoder/decoder unit for differentially encoding/decoding n pieces of input digital signal series to produce n pieces of differentially coded signal series; an error correction unit including a Reed-Solomon encoder and a Reed-Solomon decoder, provided inside the quadrature differential encoder/decoder unit along a signal processing path of the input digital signal series, for error-correcting the n pieces of differentially-coded signal series by utilizing at least one of the digital signal series with employment of a Reed-Solomon code; and, a QAM modulator/demodulator unit for QAM-modulating/demodulating n pieces of error-corrected signal series so as to produce $2^n$ QAM signals.

16 Claims, 14 Drawing Sheets

PRIOR ART
FIG.1
(GRAY MAPPING)

[00]  [10]  | [10]  [00]
   (01)    |   (11)
[01]  [11] | [11]  [01]     $(I_1, Q_1)$
-----------+-----------  I
[01]  [11] | [11]  [01]     $[I_2, Q_2]$
   (00)    |   (10)
[00]  [10] | [10]  [00]

PRIOR ART
FIG.2
(QUADRANT SYMMETRY MAPPING)

[00]  [01]  | [10]  [00]
   (01)    |   (11)
[10]  [11] | [11]  [01]     $(I_1, Q_1)$
-----------+-----------  I
[01]  [11] | [11]  [10]     $[I_2, Q_2]$
   (00)    |   (10)
[00]  [10] | [01]  [00]

REED-SOLOMON ENCODER 13

SYNDROME GENERATOR 50

(NATURAL BINARY MAPPING)

PRIOR ART
FIG.15A  NATURAL BINARY MAPPING

| PHASE REFERENCE ERROR | RECEIVED DATA | |
|---|---|---|
| | $I_1 \; I_2 \cdots I_{n/2}$ | $Q_1 \; Q_2 \cdots Q_{n/2}$ |
| 0 | $x_1 \; x_2 \cdots x_{n/2}$ | $y_1 \; y_2 \cdots y_{n/2}$ |
| $\pi/2$ | $y_1 \; y_2 \cdots y_{n/2}$ | $\bar{x}_1 \; \bar{x}_2 \cdots \bar{x}_{n/2}$ |
| $\pi$ | $\bar{x}_1 \; \bar{x}_2 \cdots \bar{x}_{n/2}$ | $\bar{y}_1 \; \bar{y}_2 \cdots \bar{y}_{n/2}$ |
| $3\pi/2$ | $\bar{y}_1 \; \bar{y}_2 \cdots \bar{y}_{n/2}$ | $x_1 \; x_2 \cdots x_{n/2}$ |

PRIOR ART
FIG.15B  GRAY MAPPING

| PHASE REFERENCE ERROR | RECEIVED DATA | |
|---|---|---|
| | $I_1 \; I_2 \cdots I_{n/2}$ | $Q_1 \; Q_2 \cdots Q_{n/2}$ |
| 0 | $x_1 \; x_2 \cdots x_{n/2}$ | $y_1 \; y_2 \cdots y_{n/2}$ |
| $\pi/2$ | $y_1 \; y_2 \cdots y_{n/2}$ | $\bar{x}_1 \; x_2 \cdots x_{n/2}$ |
| $\pi$ | $\bar{x}_1 \; x_2 \cdots x_{n/2}$ | $\bar{y}_1 \; y_2 \cdots y_{n/2}$ |
| $3\pi/2$ | $\bar{y}_1 \; y_2 \cdots y_{n/2}$ | $x_1 \; x_2 \cdots x_{n/2}$ |

PRIOR ART
FIG.15C  QUADRANT SYMMETRY MAPPING

| PHASE REFERENCE ERROR | RECEIVED DATA | |
|---|---|---|
| | $I_1 \; I_2 \cdots I_{n/2}$ | $Q_1 \; Q_2 \cdots Q_{n/2}$ |
| 0 | $x_1 \; x_2 \cdots x_{n/2}$ | $y_1 \; y_2 \cdots y_{n/2}$ |
| $\pi/2$ | $y_1 \; x_2 \cdots x_{n/2}$ | $\bar{x}_1 \; y_2 \cdots y_{n/2}$ |
| $\pi$ | $\bar{x}_1 \; x_2 \cdots x_{n/2}$ | $\bar{y}_1 \; y_2 \cdots y_{n/2}$ |
| $3\pi/2$ | $\bar{y}_1 \; x_2 \cdots x_{n/2}$ | $x_1 \; y_2 \cdots y_{n/2}$ |

QUADRATURE AMPLITUDE MODULATION COMMUNICATION SYSTEM WITH TRANSPARENT ERROR CORRECTION

BACKGROUND OF THE INVENTION

1. Field of the Invention

The present invention generally relates to a multi-level QAM (quadrature amplitude modulation) system for transferring a digital signal by utilizing multi-level quadrature amplitude modulation. More specifically, the present invention is directed to a QAM communication system capable of increasing signal transmission reliability by employing a transparent error correcting method.

2. Description of the Related Art

In a multi-level quadrature amplitude modulation (QAM) communication system in which multi-bit data such as 4 bit data and 8 bit data are transferred with reference to one signal point on a phase plane coordinate including $2^n$ ("n" being the data bit number) signal points and original data are reproduced based upon the relationship between the amplitude and phase, utilization efficiency for a frequency becomes high so that this QAM communication system has been widely utilized in digital microwave communications and digital mobile communications.

As previously stated, the signal transmission of the multi-level QAM communication system is carried out by employing the QAM signals produced by synthesizing two orthogonal I-channel and Q-channel signals corresponding to each m-level amplitude-modulated signal. Each of these multi-level QAM signals owns $m^2$ ($=2^n$) pieces of signal points. For instance, if "m" is selected to be 16 (n=8), this multi-level QAM signal is equal to 256 pieces of QAM signals having 256 signal points.

In a QAM type receiving system employing synchronous demodulation, a carrier wave is first reproduced from this multi-level QAM signal, and then demodulated by utilizing 2 orthogonal-reproduced carrier waves having different phases with each other at 90° (degrees), and thereafter "n" pieces of digital signal series are obtained in total by way of the multi-level identification. In general, there is a drawback in this QAM receiving system in that the phases of the reproduced carrier waves derived from the carrier wave reproducing circuit have a so-called "phase ambiguity", i.e., the phase becomes any of 0°, 90°, 180°, and 270°. Generally speaking, since a transmission signal series cannot be correctly reproduced if phase ambiguity exists, it is required to employ same means for eliminating the adverse influences caused by this phase ambiguity. To this end, there are some solutions to resolve such a phase ambiguity. That is, for instance, a known signal series is periodically transmitted, whereas the phases of the reproduced carrier waves are discriminated based upon the relationship between this known signal series and the signal which has been demodulated and judged by the reproduced carrier waves having the phase ambiguity at the signal reception side. Otherwise, a transmission information signal is differential-encoded so as to be transmitted, which does not directly correspond to the transmission phase, but corresponds to a relative phase difference of a continuous transmitting symbol. At a signal reception end, when this differential-encoded signal is differential-encoded after being demodulated by the reproduced carrier waves, the phase ambiguity in the reproduced carrier waves can be resolved. In general, since a 1 bit error is expanded to a continuous 2-bit error, the differential encoding/decoding method has the advantage that a circuit arrangement thereof is simple, although the bit error rate in the received signal series is increased as compared with that of the first-mentioned solution method for judging the absolute phase. Moreover, to suppress an increase of a bit error rate caused by a differential coding method, there is another method in which signal point mapping of a QAM signal is quadrant symmetry mapping. In accordance with the last-mentioned method, since the judgement concerning the upper 2 bits of the input digital signals which is determined by the orthogonal axes (i.e., I-axis and Q-axis) on the phase plane is adversely influenced by the phase ambiguity, the differential coding operation is required. However, the judgement concerning other bits thereof which is determined by the respective amplitude levels of the I-axis and Q-axis, is not adversely influenced by the phase ambiguity, so that no differential coding operation is required.

Although the QAM modulation method has the advantage of higher frequency utilization, there is a drawback in that when the number of the bits transmitted with 1 symbol, namely the value of "n", is increased, the bit error rate is deteriorated even when the transmission power per 1 bit is selected to be equal. Under such a circumstance, it is required to improve the bit error rate in the multi-level QAM communication system by employing an error correcting method. On the other hand, a QAM modulation system is originally employed so as to increase the frequency utilization efficiency, and accordingly, there is a severe restriction in the available frequency band in systems which employ the QAM modulation method, such as a digital microwave radio communication system. As a consequence, it is expected to utilize a higher coding rate having a less redundant bit to be added to the input digital signal in the error correcting method.

Furthermore, various limitations are provided in applying the error correcting method to the QAM communication system with employment of the above-described differential coding system. First, when the error correcting encoder and decoder are provided outside the differential encoding/decoding processors, since the 1 bit error occurring on the signal transmission channel is expanded to the 2-bit error due to the differential decoding process, the loads required for the error correcting encoder and decoder become large. In other words, error correction codes having greater correction capability are required so as to achieve the same reliability as that of the other case where the error correcting encoder and decoder are provided inside the differential encoding/decoding processors. As a result, since the redundant bit number to be added to the input digital signal is increased, there are problems in that the resultant utilization efficiency of frequency is lowered and the circuit arrangement of the error correcting decoder becomes extensive.

It should be understood that the expression "outside" and "inside" described above are defined as follows. That is, for instance, the error correcting encoder and decoder are positioned outside the differential encoding/decoding circuits in a circuit arrangement provided along the flow path of an input digital signal (i.e., along a signal processing sequence).

Conversely, in the case in which the error correcting encoder and decoder are provided inside the differential encoding/decoding circuits along the signal processing path, the adverse influence caused by the phase ambiguity in the reproduced carrier waves is not yet resolved at the input unit of the error correcting encoder. As a result, in such a case, it is required to employ such an error correcting code, namely a transparent error correcting code, even if the input signal is adversely influenced by the phase ambiguity in the reproduced carrier waves, e.g., there is bit inversion of the input signal, the error correction can be correctly performed with respect to the bit-inverted input signals.

As an error correcting code, there are a binary error correcting code and a nonbinary error correcting code. When a transparent binary error correcting encoder is employed inside differential encoding/decoding circuits, the transparency can be established by employing error correcting encoders/decoders in "n" pieces of a signal series. However, this system has a drawback in that when the multiple number of the QAM system is increased, the total number of the required error correcting encoders/decoders is also increased. In addition, there is a drawback in the binary error correcting code such that it is very difficult to produce a code whose coding rate is extremely high. When the decoding delay time of the error correcting code is, for instance, 63 symbols, even the resultant coding rate of the binary BCH (Bose-Chaudhuri-Hocquenghem) codes (63, 57) is 90.5%, by which a single error can be corrected, and thus the frequency band is expanded by approximately 10%. On the other hand, when the nonbinary error correcting code is employed, many difficulties may occur in realizing the above-described transparent conditions. Although it has been proposed that the signal point mapping of the QAM signal is the natural binary mapping and the Lee error correcting code is employed, since only such a case that errors occur in the signal points near the transmission signal points can be corrected based upon the Lee error correcting code, the error correcting effect cannot be expected in a communication channel or path which are subjected to a fading phenomenon. In addition, the coding rate of the Lee error correcting code is not always as good as other nonbinary codes.

As previously described, in the conventional QAM communication system employing the binary error correcting code, there are problems since the coding rate cannot be high so that the efficiency in the frequency utilization is lowered and also the total number of the required error correcting encoders/decoders to perform the differential encoding operation is necessarily increased. Furthermore, in accordance with the conventional QAM communication system employing the Lee error correcting code, there are drawbacks in that error correction can be executed limited only to the signal points having a small distance on signal point mapping.

The above-described problems of the conventional multi-level QAM communication system will now be described in detail.

That is, while the original data is reproduced from the received signal in the conventional multi-level QAM communication system, since the capture phase of the reproduced carrier wave has phase ambiguity such as 0, $\pi/2$, $\pi$ or $3\pi/2$ radians, the two digital signal series to determine the quadrant of the phase plane are generally differential-encoded/decoded by employing the quadrant differential encoder/decoder.

On the other hand, there exist a natural binary mapping method, a Gray code mapping method and a quadrant symmetry mapping method as a signal point mapping method for mapping $2^n$ pieces of signal points from the n bits of the digital signals.

As typical examples, FIG. 1 represents signal point mapping for a 16-QAM communication system employing the Gray mapping method, whereas FIG. 2 represents another signal point mapping for a 16-QAM communication system employing quadrant symmetry mapping. Further, FIG. 14 indicates signal point mapping employing natural binary mapping. As is apparent from FIG. 1, the respective signal points are symmetrically positioned with respect to the respective I and Q coordinate axes in Gray coded mapping. To the contrary, the signal points positioned in the respective quadrants are arranged in quadrant symmetry mapping in such a manner that these signal points are rotated with respect to those of the adjoining quadrants.

In these mapping methods shown in FIGS. 1, 2 and 14, the influences caused by the phase shifts of $\pi/2$, $\pi$, and $3\pi/2$, which are given to the received signal series, are expressed in FIGS. 15A to 15C.

In general, it is known that the transmission capacity and frequency utilization efficiency in such a multi-level QAM communication system can be increased by increasing the signal points. However, the more the bit numbers are increased, the more the bit error rate is increased due to imperfections in the systems. It is desired that the error correction encoding/decoding operations be performed by slightly lowering the frequency utilization efficiency so as to improve the QAM communication quality.

Thus, as previously stated, in the case that the error correction encoder and decoder are provided outside the differential encoding/decoding circuits along the signal processing path, since the continuous bit errors are produced by the differential encoding operation, the error correcting capability of the error correction code must be emphasized or an interleaver must be employed.

However, when the error correcting capability of the error correction code is increased, the frequency utilization efficiency is deteriorated. When the interleaver is newly employed, not only the circuit scale of the entire system becomes large, but also the decoding delay time is increased. As a consequence, it is generally accepted to arrange such an error correction encoder/decoder inside the differential encoder/decoder.

It should be noted that when the error correcting encoder/decoder are arranged inside the differential encoder/decoder, error correction must be correctly performed even when the signal series are varied as represented in FIG. 14 due to the ambiguity of the capture phase in the reproduced carrier wave, and simultaneously, the phase ambiguity must be preserved even when the error correction encoding/decoding operations are carried out. It should be also noted that the error correction code which can satisfy such a condition is called as a transparent code with respect to phase rotation in an input signal.

Conventional circuit arrangements for the transparent codes with respect to the phase rotations in the input signals, have been proposed in Japanese KOKAI (Disclosure) patent application No. 63-219252, and "6GHZ 140MBPS DIGITAL RADIO REPEATER WITH 256QAM MODULATION" by Y. Yoshida et al., Proceedings of International Conference on Communications 1986, No. 46-7, pages 1482 to 1486.

In the multi-level QAM communication system as disclosed in the above-described Japanese KOKAI patent application No. 63-219252, there are various drawbacks. That is, since the error correction encoding/decoding operations are independently performed with respect to each of "n" pieces of a digital signal series which constitute the in-phase channel and also the channel orthogonal to the in-phase channel, "n" pieces of encoders and decoders are required. As a result, the scale of the entire apparatus becomes large.

On the other hand, in the multi-level QAM communication system as described in the above publication, i.e., ICC '86, No. 46-7, there is employed such an encoding/decoding method with employment of the Lee error correction code, for the respective signal series combinations between n/2 series combinations to constitute the in-phase channel and n/2 series combinations to constitute the orthogonal channel. However, this conventional communication system is limited to such a natural binary mapping method for mapping the n bits data to the signal points. Furthermore, there are many other limitations for the constituting methods of the error correction codes.

SUMMARY OF THE INVENTION

The present invention has been made in an attempt to solve the conventional problems, and therefore has a primary object to provide a QAM (quadrature amplitude modulation) communication system capable of realizing a higher coding rate and higher reliability.

Moreover, the present invention has a secondary object to provide a multi-level QAM communication system in which both the error control code and mapping methods are freely selected, a total quantity of encoders/decoders is smaller than a bit number of input digital data, and a transparent error correction coding for a phase rotation can be realized.

In addition, a third object of the present invention is to provide a multi-level QAM communication system in which clock frequencies of the error correction encoder/decoder can be lowered with respect to a modulation frequency of a quadrature amplitude modulator.

A quadrature amplitude modulation system, according to the present invention, comprises:

differential encoder/decoder means (12;17) for differentially encoding/decoding n pieces of input digital signal series to resolve phase ambiguity contained in the differentially encoded input signal series;

error correction means including a Reed-Solomon encoder (13;83) and a Reed-Solomon decoder (16;87), provided inside said differential encoder/decoder means (12;17) along a signal processing path of said input digital signal series, for error-control-encoding/decoding said n pieces of differentially-coded signal series by utilizing at least one of said digital signal series to correct errors with employment of Reed-Solomon codes; and, QAM modulator/demodulator means (14;15;34;36;80;82) for QAM-modulating/demodulating n pieces of error-control-coded signal series so as to produce $2^n$ QAM signals.

BRIEF DESCRIPTION OF THE DRAWINGS

For a better understanding of the present invention, reference is made to the following detailed descriptions in conjunction with the drawings, in which:

FIGS. 1 and 2 schematically illustrate known signal point mappings;

FIGS. 15A to 15C are tables for explaining phase reference error effects occurring in the three typical mapping methods.

DETAILED DESCRIPTION OF THE PREFERRED EMBODIMENTS

Basic Ideas

Figure 3:
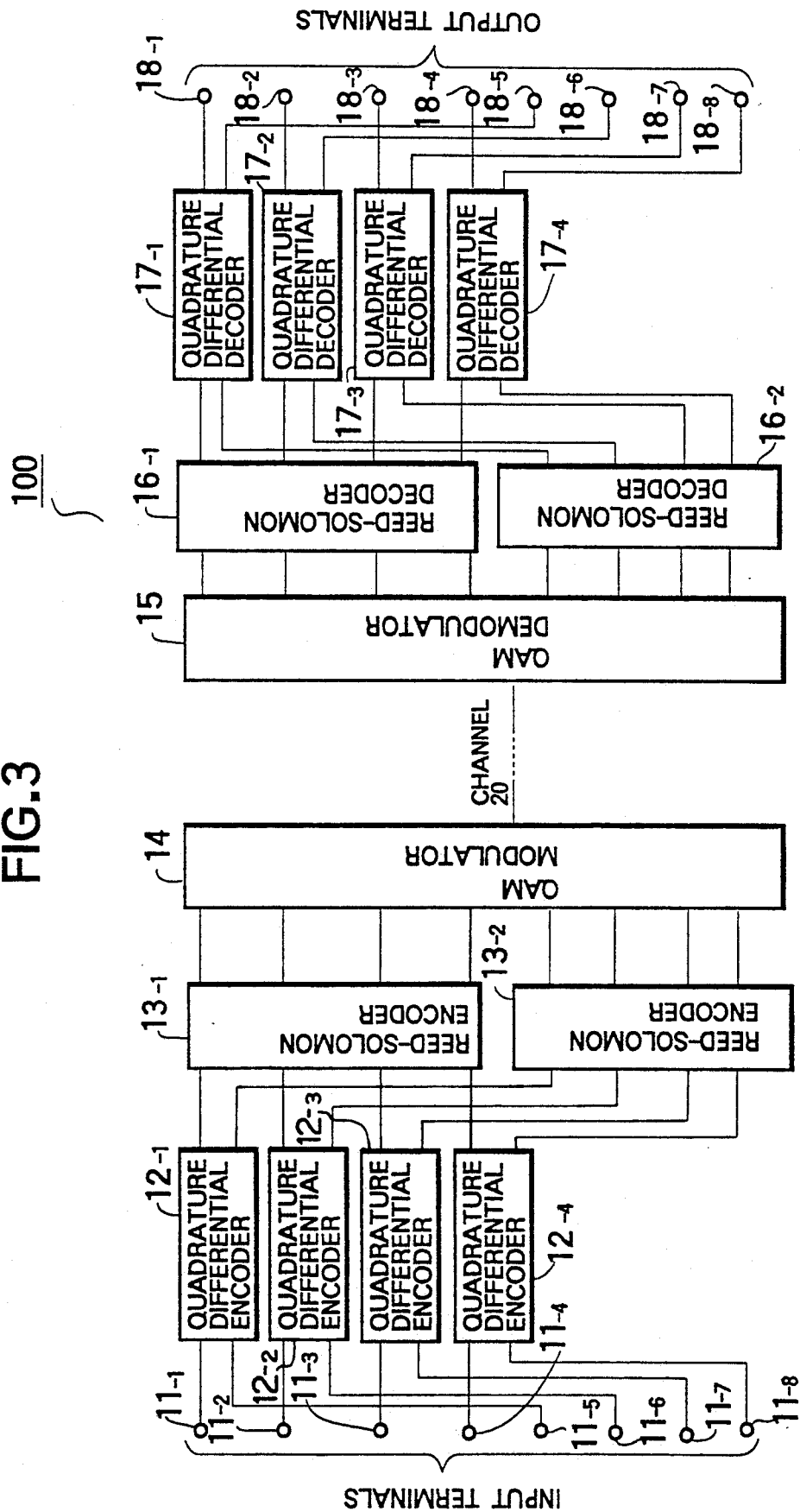
FIG. 3 is a schematic block diagram of a QAM (quadrature amplitude modulation) communication system 100 employing a first basic idea, according to a first preferred embodiment of the present invention.

Before describing various preferred embodiments, two basic ideas of the present invention will now be summarized.

A multi-level QAM (quadrature amplitude modulation) communication system according to the first basic idea of the present invention, is featured by employing error correcting means for performing both encoding and decoding operations of the Reed-Solomon code under the condition that all or a portion of "n" pieces of an input signal series for determining signal point mapping is used as a symbol. Also, in case the differential coding operation is performed by employing natural code mapping, such an error correcting means is employed to independently perform both encoding and decoding operations for the Reed-Solomon code with respect to two "I" and "Q" channels orthogonal to each other. Although there are many generator polynomials for constructing the Reed-Solomon code, such a Reed-Solomon code so that codeword polynomials are not divisible by x−1 (namely, the generator polynomial is not divisible by "x−1") is utilized so as to establish transparency.

In the above-described first QAM communication system, when (u,k) linear block codes are employed, a frequency band width expanding rate for influencing the QAM communication system is determined by the coding rate of the block codes. To correct a t-symbol, all of the linear block codes must satisfy a limit formula of $t \leq (u-k)/2$. In other words, a redundant symbol number (u-k) cannot be reduced by twice the correction capability. A Reed-Solomon code can satisfy this limit formula, so that the frequency expanding rate can be suppressed to a minimum value in such a QAM communication system employing a Reed-Solomon code.

Due to the phase ambiguity of the reproduced carrier waves, the respective "I" and "Q" channels cause signal changes different from each other. However, this adverse influence can be eliminated by independently performing both the encoding and decoding operations of the Reed-Solomon code with respect to two "I" and "Q" channels orthogonal to each other.

Furthermore, even when the signals are inverted in the QAM communication circuit due to the phase ambiguity of the reproduced carrier waves, the transparency can be established by utilizing such a Reed-Solomon code in which a generator polynomial is not divisible by x−1. That is, in case signal point mapping corresponds to natural code mapping, a necessary/satisfactory condition such that a Reed-Solomon code is equal to a transparent code, is as follows: Any codeword polynomial of the code is not divisible by x−1. Another multi-level QAM communication system according to a second basic idea, has the following features:

In a multi-level QAM communication system in which a bit number of transmitted/received data is equal to "n" and there are provided $2^n$ pieces of signal points, an error correction coding operation is separately carried out with respect to each of signal series used for determining a quadrant of a phase plane, and also with respect to to other signal series among "n" pieces of signal series for determining a signal.

As represented in FIG. 15C, in a multi-level differential QAM communication system in which signal point mapping is determined based upon quadrant symmetry mapping, a bit inversion and a signal series substitution may occur with respect the signal series ($I_1$, $Q_1$) for determining quadrants of a phase plane when the capture phases of the reproduced carrier waves are shifted by $\pi/2$, $\pi$, or $3\pi/2$. However, such a phase ambiguity of the reproduced carrier wave does not influence other signal series ($I_2$, - - -, $I_{n/2}$; $Q_2$, - - -, $Q_{n/2}$). Therefore, if an error correction coding operation has been performed for the signal series ($I_1$, $Q_1$) separately, whereby data bits which have been inverted can be decoded, even when an arbitrary error correction coding operation is carried out for other signal series ($I_2$, - - -, $I_{n/2}$; $Q_2$, - - -, $Q_{n/2}$), the transparency of this arbitrary error correction coding operation can be compensated.

Furthermore in another multi-level difference QAM communication system in which signal point mapping is determined by the Gray coding operation, as represented in FIG. 15B, a bit inversion and a signal series substitution may occur similar to the previous QAM communication system with respect to the signal series ($I_1$, $Q_1$) used for determining quadrants of a phase plane if the phases of the reproduced carrier waves are shifted. To the contrary, in other signal series, only a signal series substitution may occur between the signal series of the I-channel ($I_2$, - - -, $I_{n/2}$) and the signal series of the Q-channel ($Q_2$, - - -, $Q_{n/2}$). Therefore, such an error correction coding operation by which data whose bit has been inverted can be decoded is independently performed as to the signal series ($I_1$, $Q_1$), and an arbitrary error correction coding operation is carried out for each of combinations between other I-channel signal series and the Q-channel signal series. Thus, this coding method can establish transparency with respect to the phase rotation.

A third basic idea of the present invention is as follows. That is, "h" pieces of input signal series among "n" pieces of input signal series having $2^n$ QAM signal points are encoded by the Reed-Solomon code on a Galois field $GF(2^l)$, where "n" and "h" are integers, "n" is larger than or equal to "h", and "l" is larger than or equal to "h". When a relationship "l = A × h" is satisfied, the clock frequency of the error correcting encoder/decoder can be reduced by 1/A of the QAM modulation velocity. Also, in case of 2 h n (namely, a plurality of signal series are encoded with one Reed-Solomon code, a total number of the combinations constructed of the error correcting encoder/decoder can be selected to be smaller than the total number (n) of the input signal series.

Arrangement Of First QAM Communication System

Figure 14:
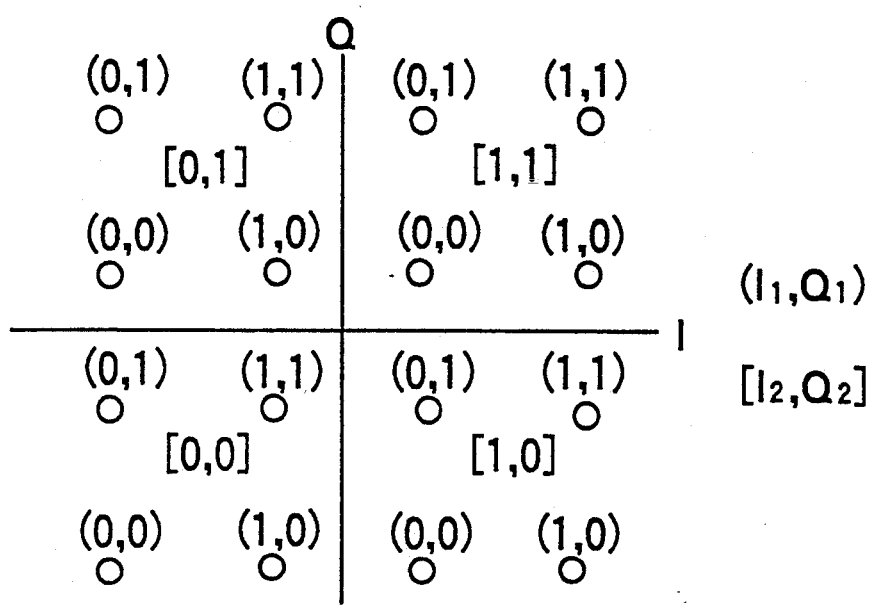
FIG. 14 schematically illustrates natural binary mapping.

In FIG. 3, there is shown an arrangement of a QAM (quadrature amplitude modulation) communication system 100 according to a first preferred embodiment of the present invention. This first QAM communication system 100 utilizes the above-described first basic idea therein, and the natural binary mapping method as represented in FIG. 14 (i.e., 16-QAM signal point mapping).

For a better understanding of this natural binary mapping method, the phase reference error effects caused by this mapping method are shown in FIG. 15A in comparison with those of other mapping methods shown in FIGS. 15B and 15C. However, such phase errors can be corrected by the QAM communication system 100 (as will be discussed in detail).

The modulator transmits each n-bit information symbol by modulating a pair of orthogonal carriers, called I and Q. Each carrier takes one of the $2^{2/n}$ amplitude levels, each representing a set of n/2 information bits, $\{I_1, I_2, \ldots, I_{n/2}\}$ or $\{Q_1, Q_2, \ldots, Q_{n/2}\}$. The demodulator regenerates the I-Q carrier with 0°, 90°, 180°, or 270° phase ambiguity.

FIGS. 15A to 15C show the phase reference error influence on the received data for the typical three signal mapping methods: natural binary, Gray, and quadrant symmetry. In the tables, $x_i$'s and $y_i$'s are transmitted bits in the sets $\{I_i\}$ and $\{Q_i\}$, respectively, where $x_i$, $y_i f\{0, 1\}$ and $i = 1, 2, \ldots, m$. For a differentially encoded multilevel QAM system, an error control scheme must be designed, taking into consideration such phase ambiguity influences.

In the first QAM communication system 100 shown in FIG. 3, 8 digital signal series input into input terminals 11-1 to 11-8 are processed by a quadrature differential coding operation in four quadrature differential encoders 12-1 to 12-4. This differential coding operation is carried out for each combination of two signal series, for instance, the respective combinations of two input signal series 11-1 and 11-5; series 11-2 and 11-6; series 11-3 and 11-7; series 11-4 and 11-8. Two output signals derived from the respective quadrature differential encoders 12-1 through 12-4 are supplied to two Reed-Solomon encoders 13-1 and 13-2 respectively. It should be noted that the generator polynomial of the first Reed-Solomon encoder 13-1 is identical to that of the second Reed-Solomon encoder 13-2. A code employed in the respective encoders 13-1 and 13-2 is a code of GF ($2^4$), and a generator polynomial G(X) thereof is not divisible by X−1. In the first and second Reed-Solomon encoders 13-1 and 13-2, the input 4-bit signals are encoded as 1 symbol. Assuming now that the generator polynomial corresponds to $G(X)=(X-\alpha)(X-\alpha^2)$, which is a primitive element of GF($2^4$), redundant 2 symbols are added to each of the input 13 symbols. Both the first and second Reed-Solomon encoders 13-1 and 13-2 output digital signals for constituting the I-axis (channel) and Q-axis to a QAM modulator 14. In the first preferred embodiment, the digital signal input into the I-axis is "x", whereas the digital signal input into the Q-axis is "y". The QAM modulator 14 modulates a signal with natural binary mapping, and transmits the modulated digital signal (QAM signals) to the signal transmission channel 20. A QAM demodulator 15 reproduces a carrier wave from the quadrature amplitude modulated (QAM) signal received via the signal transmission channel 20 from the QAM modulator 14 so as to demodulate the input QAM signal by this carrier wave. As previously described, the digital signals input into both the I-axis and Q-axis of the QAM modulator 14 are not always coincident with the output signals of the I-axis and Q-axis of the QAM demodulator 15 due to the ambiguity of phase. When the phase shifts in the reproduced carrier waves are 0° (degree), 90°, 180°, and 270° respectively, the output signals from the QAM demodulator 15 are: (I, Q)=(x,y), (x,ȳ), (x̄,ȳ) and (x̄,y) respectively, as represented in FIG. 15A. The output signal of the I-axis in the QAM demodulator 15 is supplied to a first Reed-Solomon decoder 16-1, whereas the output signal of the Q-axis in the QAM demodulator 15 is furnished to a second Reed-Solomon decoder 16-2. That is, the output signal derived from the first or second Reed-Solomon encoders 13-1 and 13-2 is directly input into the first Reed-Solomon decoder 16-1. Otherwise, the above-described output signal is once bit-inverted and the resultant bit-inverted signal is supplied to this first Reed-Solomon decoder 16-1. The second Reed-Solomon decoder 16-2 receives the output signal derived from either the first Reed-Solomon encoder 13-2 in the similar condition as described above. As the first Reed-Solomon encoder 13-1 has the same generator polynomial as that of the second Reed-Solomon encoder 13-2, the following condition is required so as to establish that the error correction encoder and decoder, i.e., the Reed-Solomon encoder/decoder are transparent. That is to say, even when all of the bits of the transmitted code words are inverted, the transparency can be established if the complement of a valid codeword is a valid codeword. As will be discussed later, if the generator polynomial of the code word generated in both the Reed-Solomon encoders 13-1 and 13-2 is not divisible by x−1, the desirable code words can be obtained even when all of bits of code words are inverted. As a consequence, a 1-symbol error occurring on the signal transmission channel 20 can be corrected in both the Reed-Solomon decoders 16-1 and 16-2. Thus, the outputs derived from the Reed-Solomon decoders 16-1 and 16-2 are furnished to four quadrature differential decoders 17-1 to 17-4 under such a condition that the corresponding signal series are combined. In the quadrature differential decoders 17-1 to 17-4, the quadrature differential decoding operation is carried out for these input signals so as to reproduce desirable signals which will be then output from output terminals 18-1 to 18-8.

In accordance with the first preferred embodiment, there is a particular advantage in that the 1 symbol error can be realized at a coding rate of 87%. In comparison with the conventional single-error-correction binary BCH(Bose-Chaudhuri-Hocquenghem) code under the same delay time condition, it becomes a (15, 11) code so that the coding rate becomes merely 73%. To the contrary, as previously described, there is another particular advantage that the frequency can be utilized with a considerably higher efficiency.

DESIRED CODE WORD

Even when all of bits of an input signal are inverted, a valid code word can be obtained if a generator polynomial is not divisible by x−1, which will be certified as follows. Considering a Reed-Solomon code of GF ($2^s$), it is assumed that that $m = 2^s − 1$ and a primitive element of GF($2^s$) is $\alpha$. Also, it is assumed that among symbols $\alpha^o$ to $\alpha^m$ constructed of s bits, $\alpha^b = (1, 1, \ldots, 1)$. The Galois Field GF($2^s$) is an extension field of GF(2), which results in $2 \cdot X^i = 0$. As a consequence, it can be expressed by $(X^m - 1) = (X-1) \cdot (X^{m-2} \cdots + X + 1)$. Then, $X^m - 1$ contains as a factor the generator polynomial G(X). As a consequence, if G(X) does not contain X=1 as a root, since the generator polynomial $(X^{m-1} + X^{m-2} \cdots + X + 1)$ all of coefficients of which are $\alpha^0 = (0, \cdots, 0, 1)$ includes G(X) as the factor, the codeword corresponding to all one polynomial is a valid codeword. The all $\alpha^b$ polynomial $(\alpha^b X^{m-1} + \alpha^b X^{m-2} + \cdots + \alpha^b X + \alpha^b)$, all bits of which are 1, namely all coefficients are "$\alpha^b$", may be rewritten as $\alpha^b \cdot (X^{m-1} + X^{m-2} \cdots + X + 1)$, so that it contains G(X) as a factor and thus the codeword all bits which are 1 is a valid codeword. Accordingly, since the received signal all bits of which have been inverted, is equal to a signal obtained by adding the codeword corresponding to $(\alpha^b X^{m-1} + \alpha^b X^{m-2} \cdots + \alpha^b X + \alpha^b)$ to the transmitted code word S(X), this signal becomes a codeword. It should be noted that the generator polynomial of the Reed-Solomon code is given by $$G(X) = \prod_{i=r}^{d-2+r} (X - \alpha^i) = (X - \alpha^r)(X - \alpha^{r+1}) \cdots (X - \alpha^{d-2+r}),$$

and this generator polynomial is defined in the following equation (3), for instance i=1, in order not to contain X=1 as a root:

$$G(X) = (G - \alpha) \cdots (X - \alpha^{d-1}) \tag{3}$$

where a symbol "d" indicates the minimum distance of the code.

SECOND QAM COMMUNICATION SYSTEM

In the above-described first QAM communication system 100, the 4-bit input signal has been coded as 1 symbol. Alternatively, in a second QAM communication system 200 shown in FIG. 4, an 8-bit input signal is coded as 1 symbol. The above-described third object of the present invention can be achieved by this second QAM communication system 200 employing the first basic idea and also the neutral binary mapping method. That is, the second QAM communication system 200 has such a particular advantage that clock frequencies of the error correction encoder/and decoder can be selected to be lower than a modulating frequency of a quadrature amplitude modulator.

It should be noted that the same reference numerals shown in FIG. 3 will be employed as those for denoting the same or similar circuit elements shown in the following figures, and no further explanation thereof is made in the following descriptions.

Figure 4:
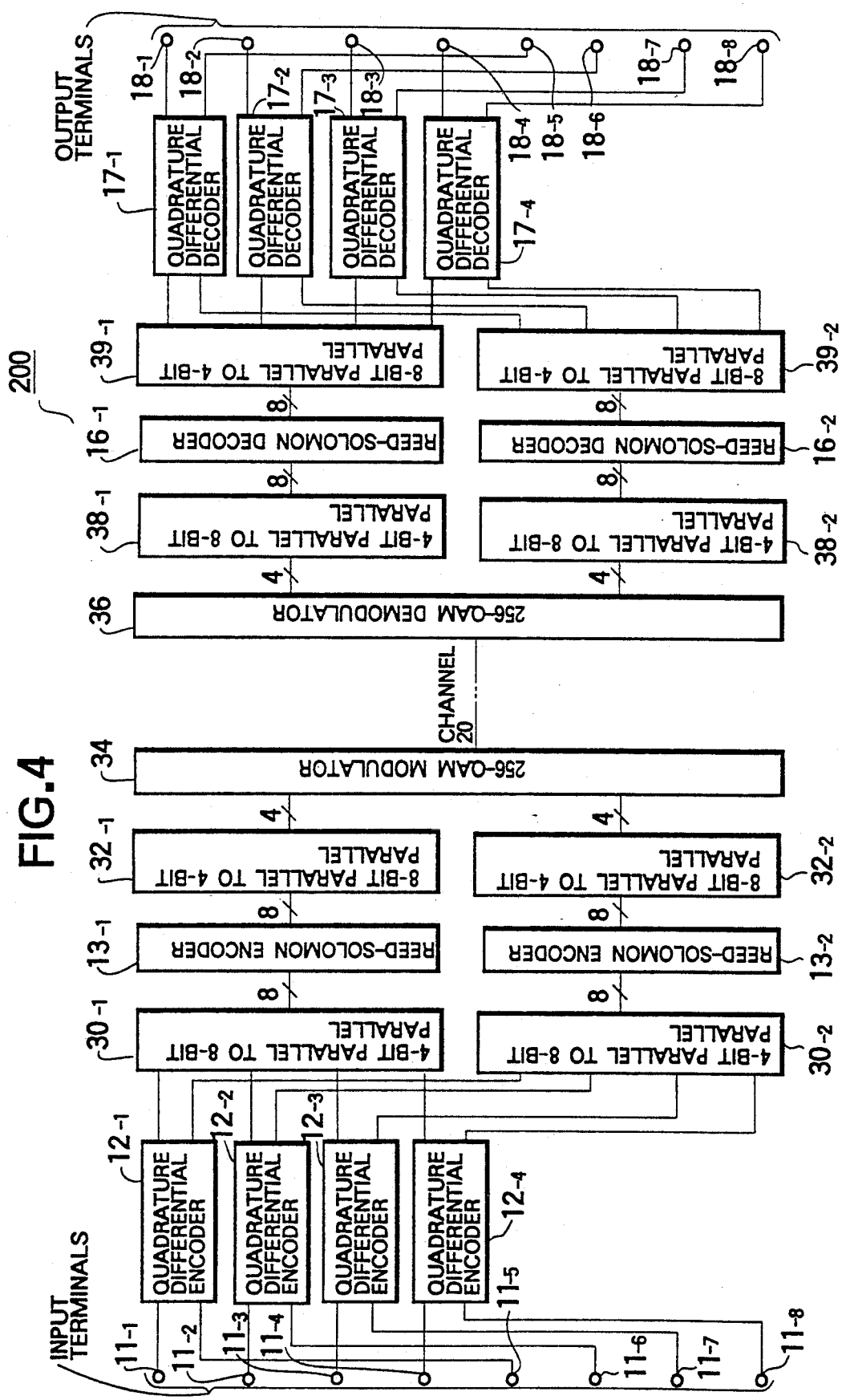
FIG. 4 is a schematic block diagram of another QAM communication system 200 employing the first basic idea, according to a second preferred embodiment of the present invention.

In the second QAM communication system 200 shown in FIG. 4, digital signals inputted into 8 input terminals 11-1 to 11-8 are supplied to 4 quadrature differentail encoders 12-1 to 12-4 so as to be processed by a predetermined quadrature differential encoding process. The 8 differential-encoded 4-bit digital signals are furnished to two 4-to-8 bits parallel-to-parallel converters 30-1 and 30-2 thereby to obtain two pieces of 8-bit parallel data. These 8-bit parallel data are further supplied to 2 Reed-Solomon encoders 13-1 and 13-2 which are similar to the Reed-Solomon encoders employed in the first QAM communication system 100, so that these 8-bit parallel data are processed by a predetermined Reed-Solomon encoding process. Subsequently, these encoded 8-bit parallel data are input into a 256-QAM modulator 34 via two 8 to 4 bits parallel/parallel converters 32-1 and 32-2.

The 4-bit digital data which has been modulated in this 256-QAM modulator 34, is further supplied via the signal transmission channel 20 to a 256-QAM demodulator 36, whereby this 4-bit modulated digital data is demodulated therein. Thus, the demodulated 4-bit digital data is once converted into corresponding 8-bit parallel data by two sets of 4-to-8 bits parallel/parallel converters 38-1 and 38-2. Then, two pieces of 8-bit parallel data are decoded in the respectiven Reed-Solomon decoders 16-1 and 16-2. Thereafter, the decoded 8-bit parallel data are again converted into 8 pieces of 4-bit parallel data in two 8-to-4 bits parallel/parallel converters 39-1 and 39-2 and then are processed by a differential decoding process in 4 quadrature differential decoders 17-1 to 17-4, respectively. The resultant 8 pieces of digital signals are obtained from 8 output terminals 18-1 to 18-8.

Similarly, in accordance with the above-described second QAM communication system 200, the codes employed in these Reed-Solomon encoders 13-1 and 13-2 are GF($2^8$), and the generator polynomial thereof G(X) is not divisible by x−1 as the root. Since the Reed-Solomon encoders 13-1 and 13-2 perform the coding operations for the 8 bits digital signal as 1 symbol, there are provided the 4-to-8 bits parallel/parallel converting circuits 30-1 and 30-2 and the 8-to-4 bit parallel/parallel converting circuits 32-1 and 32-2 therebetween.

Assuming now that the generator polynomial G(X) of this code is expressed by:

$$G(X) = (X - \alpha)(X - \alpha^2)(X - \alpha^3)(X - \alpha^4) \quad (4)$$
$$= X^4 + \alpha^{76}X^3 + \alpha^{251}X^2 + \alpha^{81}X + \alpha^{10},$$

a redundancy of four symbols are added thereto every time 251 symbols are input into the Reed-Solomon encoders 13-1 and 13-2. An internal circuit of the respective Reed-Solomon encoders 13-1 and 13-2 is constructed as represented in, for instance, FIG. 5.

Figure 5:
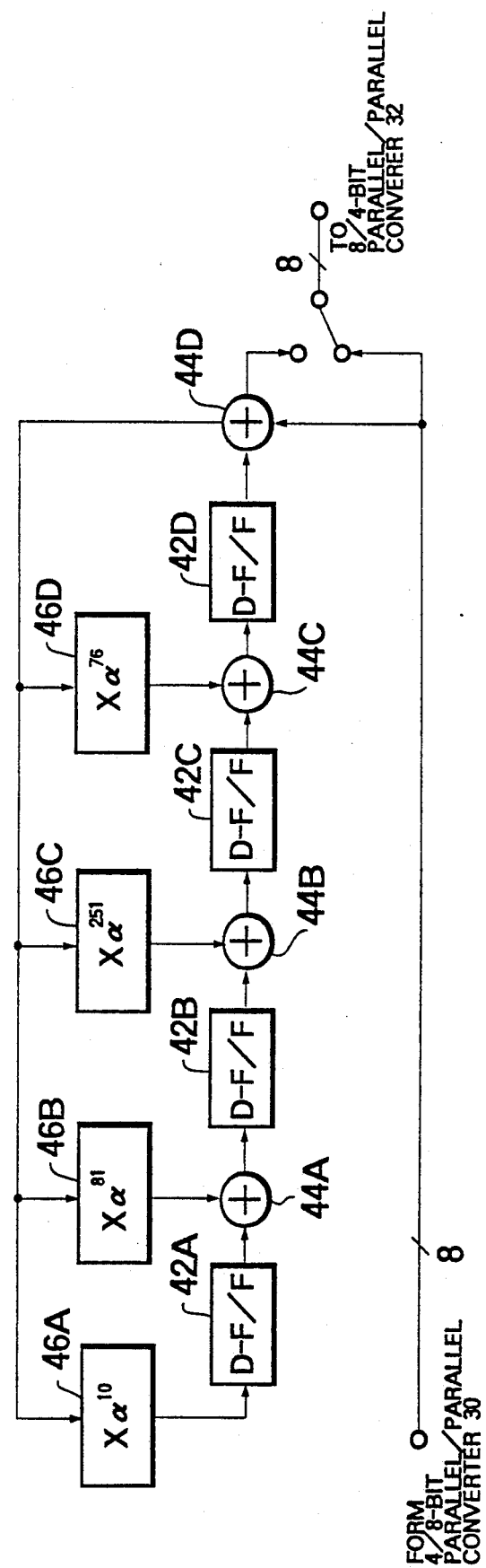
FIG. 5 is a schematic block diagram of an internal circuit of the Reed-Solomon encoder 13 employed in the second QAM system 200.

This Reed-Solomon encoder 13 per se shown in FIG. 5 is known in this field. In this Reed-Solomon encoder 13, four D flip-flops 42A to 42D, four multipliers 46A to 46D, and four adders 44A to 44D are mutually connected as represented in FIG. 5. These adders 44A to 44D perform the adding operation over GF ($2^8$), whereas the multipliers 46A to 46D perform the multiplication over GF($2^8$). As a result, the encoder 13 is constructed based upon the transparent Reed-Solomon code.

In the second QAM communication sytem 200 with the above-described circuit arrangement, an error less than 2 symbols occurring in the signal transmission channel 20 can be corrected by the Reed-Solomon decoders 16-1 and 16-2.

Figure 6:
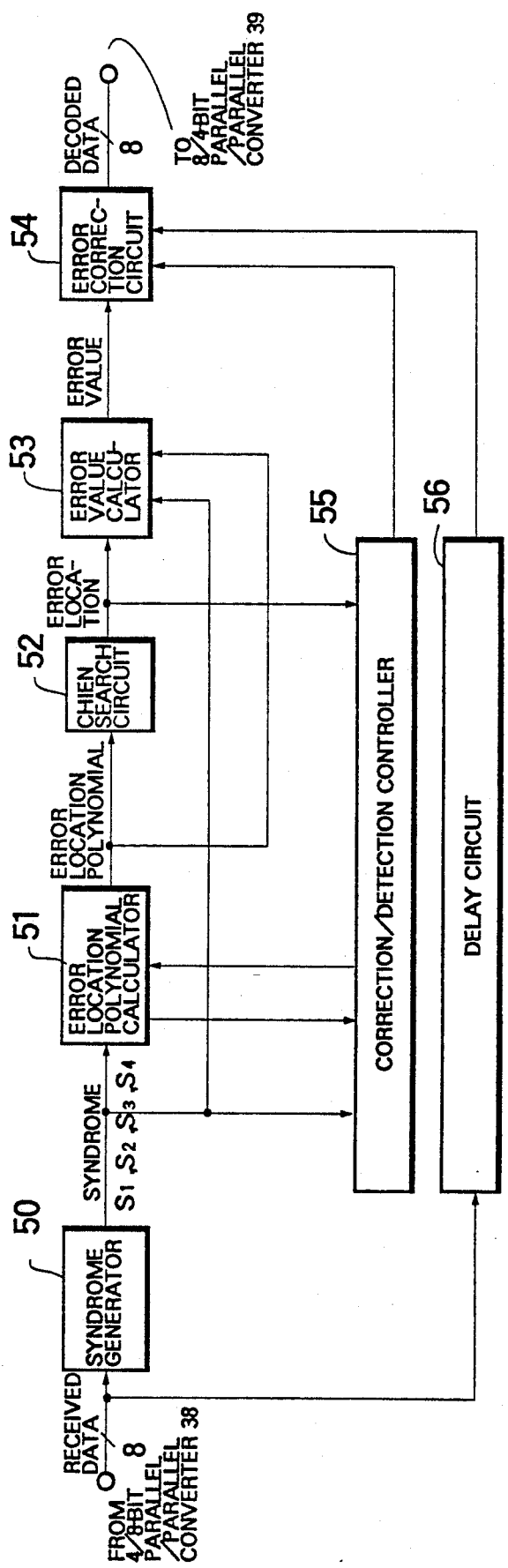
FIG. 6 is a schematic block diagram of an internal circuit of the Reed-Solomon decoder 16 employed in the second QAM system 200.

These Reed-Solomon decoders 16-1 and 16-2 may be realized by a circuit arrangement shown in FIG. 6.

Similarly, the Reed-Solomon decoder 16 itself represented in FIG. 6 is known in the art. This Reed-Solomon decoder 16 is constructed of a syndrome generator 50, an error location polynomial calculator 51, a Chien search circuit 52, an error value calculator 53, and an error correction circuit 54. Furthermore, a correction/detection controller 55 is employed to receive the output signals derived from the syndrome generator 50, error location polynomial calculator 51 and Chien search circuit 52. Both the error location polynomial calculator 51 and error correction circuit 54 are under control of this correction/detection controller 55. To this error correction circuit 54, data which has been obtained by delaying the received 8-bit data is supplied.

Figure 7:
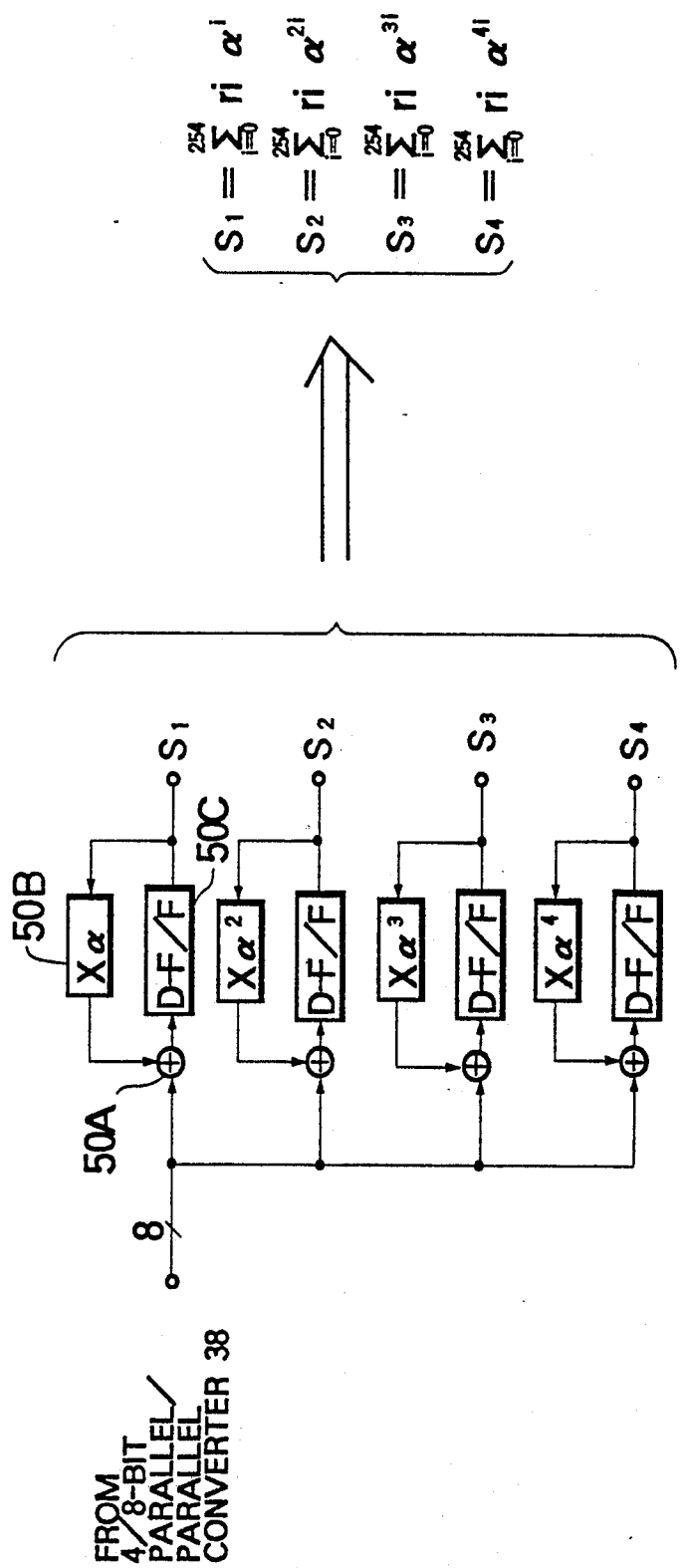
FIG. 7 is a schematic block diagram of an internal circuit of the syndrome generator 50 employed in the second QAM system 200.

In FIG. 7, there is shown an internal circuit arrangement of this syndrome generator 50. As apparent from FIG. 7, the syndrome generator 50 is so constructed by employing 4 sets of circuit arrangements each including an adder 50A, multiplier 50B, and D flip-flop 50C. These multipliers carry out the multiplication with $\alpha$, $\alpha^2$, $\alpha^3$ and $\alpha^4$ times x. The syndrome output signals "$S_1$" to "$S_4$" are derived from these four lines and represented in the right-half portion of FIG. 7.

According to the above-described second preferred embodiment, the above-explained 2-symbol error correction can be realized at the coding rate of 98.4%. If the conventional binary BCH code for correcting two errors would be utilized under the same delay time condition, it will become (511,493) codes at the coding rate 96.5%. As a consequence, the frequency can be effectively utilized in the second QAM communication system 200. Moreover, if the conventional binary BCH code, or Lee error correction code is employed in the conventional QAM communication system, the clock frequencies of the encoders and decoders cannot be lower than the modulating frequency. To the contrary, as described in the second preferred embodiment, in the case that 1 symbol of the Reed-Solomon code is allocated to 2 modulation symbols, the clock frequencies of the encoder 13 and decoder 16 can be selected to be a half of the modulation velocity (modulating frequency). As previously stated, since the clock frequencies of the encoder 13 and decoder 16 can be lower than the modulation velocity in accordance with the second preferred embodiment, there is a particular advantage in designing the error correction circuit of the high-speed data transmission system.

It should be noted that the generator polynomial with respect to the second QAM communication system 200 is not divisible by x−1.

Figure 12:
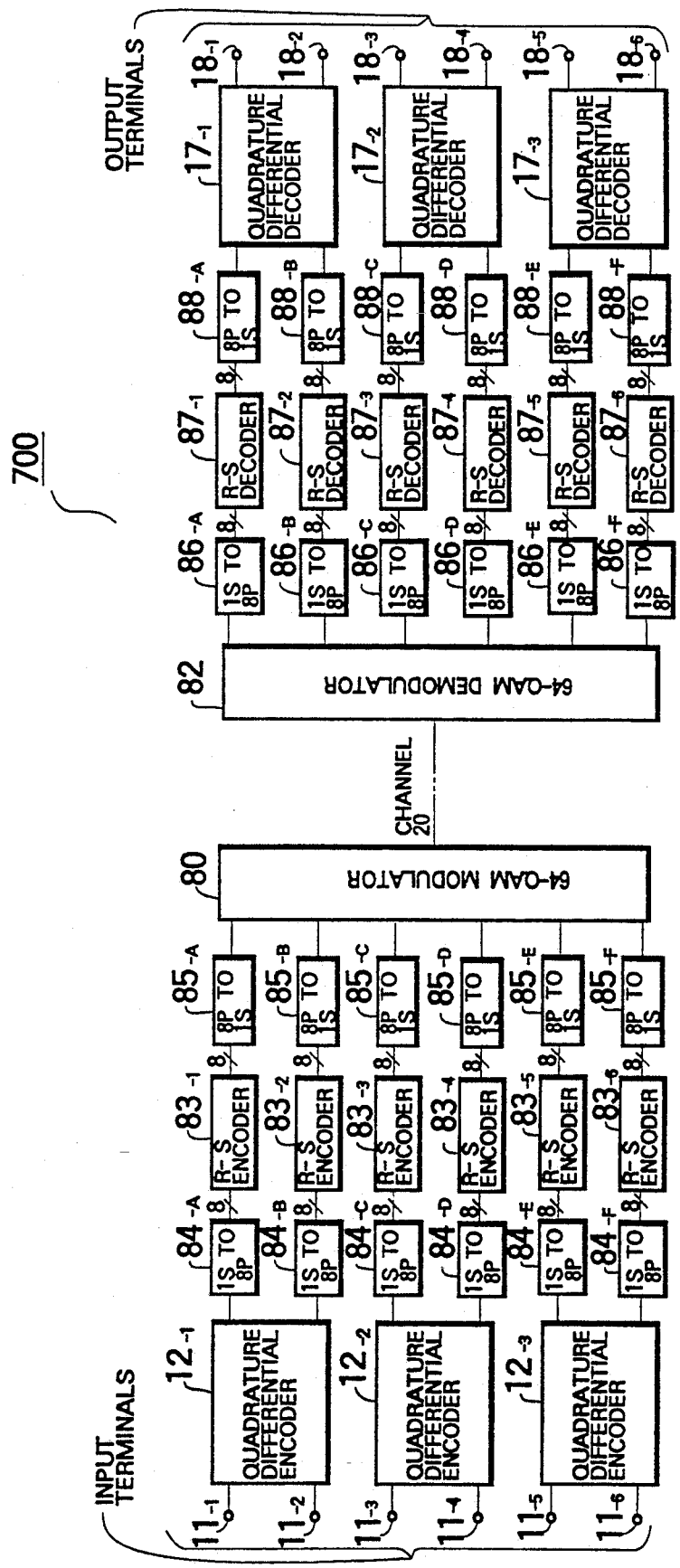
FIG. 12 is a schematic block diagram of another 64-QAM communication system 700 employing the first basic idea, according to a seventh preferred embodiment of the present invention.

As described in FIG. 12, many other modifications may be realized without departing from the first basic idea of the present invention, that is, the Reed-Solomon code is utilized while maintaining the transparency of the error correction code.

While the multi-level QAM communication system capable of having a transparent error correction with employing the first basic idea of the present invention has been described, the frequency efficiency can be considerably increased as compared with that of the conventional QAM communication system. In other words, not only the frequency utilization efficiency can be improved, but also the total number of the encoders/decoders can be reduced, in comparison with those of a conventional QAM communication system employing the binary BCH code.

Furthermore, not only the frequency utilization efficiency can be considerably improved, but also the reliability can be increased, as compared with the conventional multi-level Lee error correction code. This system has a particular merit when utilized in a for mobile communication with a fading phenomenon. According to the first basic idea of the present invention, it can provide a multi-level error correction code capable of maintaining the transparency even when the differential encoding/decoding operations are performed. That is, the transparency can be maintained by the following methods. Namely, in case that the signal point mapping is natural code mapping, such a Reed-Solomon code is employed so that (X−1) is not included in the generator polynomial as the factor.

Third QAM Communication System

Figure 8:
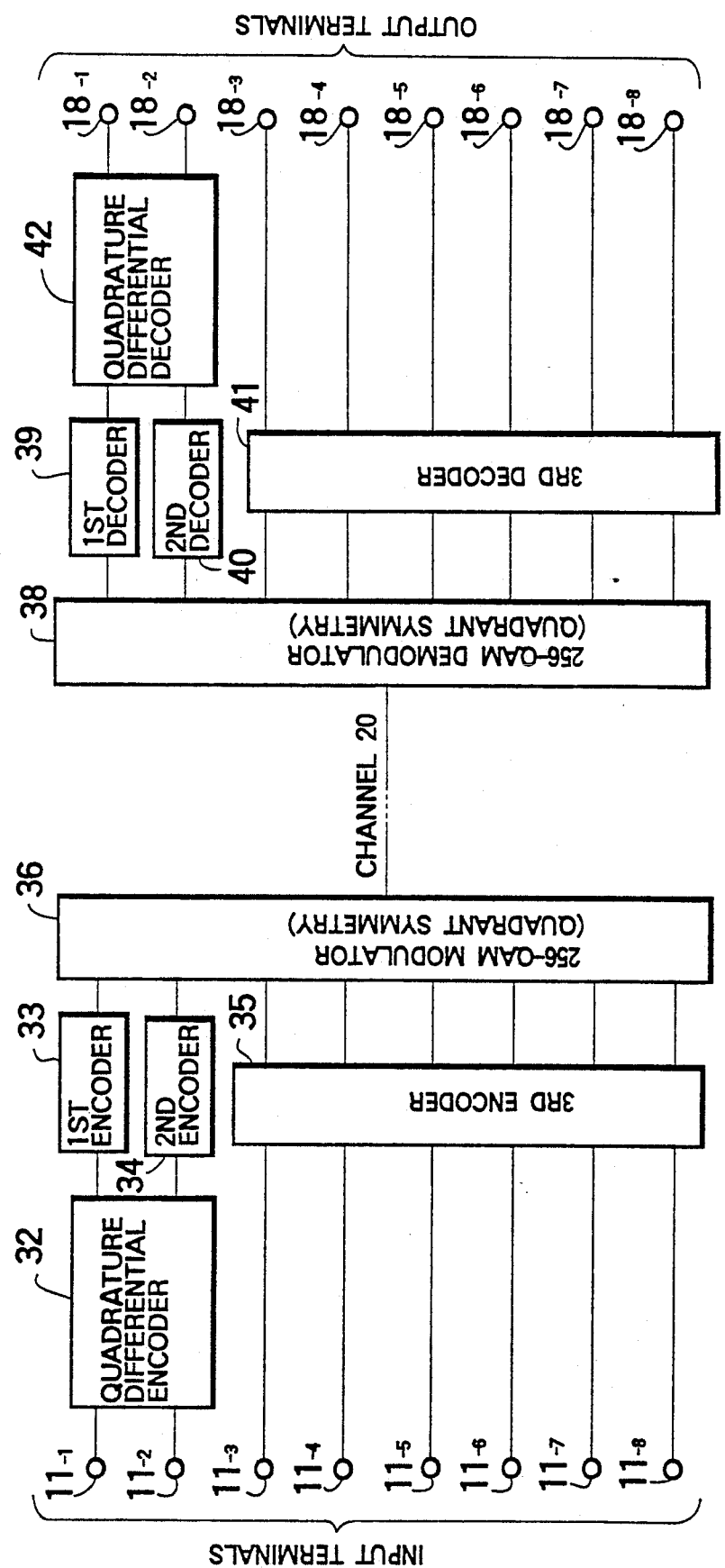
FIG. 8 is a schematic block diagram of a 256-QAM communication system 300 employing a second basic idea, according to a third preferred embodiment of the present invention.

Referring now to FIG. 8, a 256-QAM communication system 300 employing the second basic idea, according to a third preferred embodiment of the present invention, will be described.

FIG. 8 is a schematic block diagram of the 256-QAM communication system 300.

In FIG. 8 at a signal transmission side, as viewed in the left side of this drawing, 8 digital signal series are inputted via 8 input terminals 11-1 to 11-8. The 2 bits digital signals supplied from two input terminals 11-1 and 11-2 are furnished to a quadrature differential encoder 32 so as to be differential-encoded therein. Then, the resultant 2 bits differentially-encoded signals are separately supplied to first and second encoders 33 and 34 having the same function as each other, whereby 2 bits encoded data are obtained therefrom. On the other hand, 6 bits digital signals inputted from the remaining 6 input terminals 11-3 to 11-8 are supplied to a third encoder 35 thereby to obtain 6 encoded digital signals. It should be noted that the codes employed in the first and second encoders 33 and 34 are identical to each other, and correspond to such an error correction code having all 1 vectors as the code words. The code employed in the third encoder 35 may be selected to be an arbitrary code. When, for instance, a Reed-Solomon code on GF($2^6$) capable of correcting a symbol error is utilized as this code for the third encoder 35, there is a particular effect since the correction capability is great with respect to redundancy.

The 8 bits digital signals derived from the first to third encoders 33, 34 and 35 are converted by a 256-QAM modulator 36 into signal waveforms corresponding to signal points which have been mapped based upon quadrant symmetry mapping, and thereafter outputted to a signal transmission channel 20.

On the other hand, at a signal reception side, 8 bits digital signals which have been demodulated by a 256-QAM demodulator 38 are error-corrected by first to third decoders 39, 40 and 41 which correspond to the first to third encoders 33, 34 and 35. The 2 bits digital signals output from the first and second decoders 39 and 40 are differential-decoded in a quadrature differential decoder 42. Thus, the two signal series derived from the differential decoder 42 are outputted from output terminals 18-1 and 18-2, whereas the remaining signal series derived from the third decoder 41 are outputted from other output terminals 18-3 to 18-8.

In the 256-QAM communication system 300 for quadrant symmetry mapping according to the third preferred embodiment, the error correction coding operations are separately performed with respect to the combinations between the signal series for determining the quadrant of the phase plane, and other signal series, so that the transparent coding operation can be realized with respect to the phase rotations occurring between the input digital signals and output digital signals.

As a consequence, when the combinations of the signal series which have no relation to determine the quadrant of the phase plane are encoded, since a plurality of signal series can be encoded as inputs, the resultant circuit arrangement can be made small, as compared with such a case that all of the signal series are independently encoded.

Fourth QAM Communication System

Furthermore, a 256-QAM communication system 400 utilizing the second basic idea, according to a fourth preferred embodiment of the present invention, will now be described with reference to FIG. 9.

Figure 9:
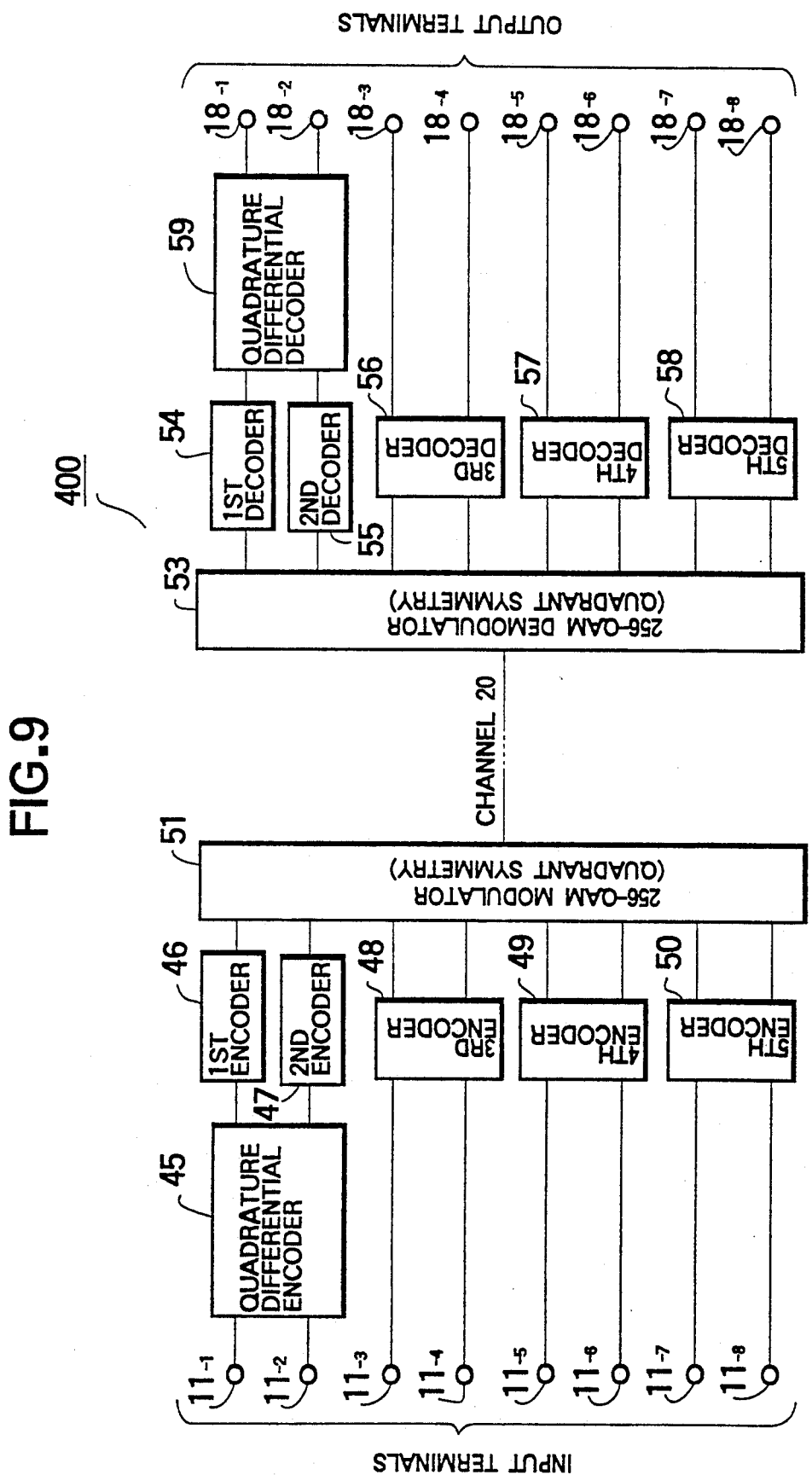
FIG. 9 is a schematic block diagram of another 256-QAM communication system 400 employing the second basic idea, according to a fourth preferred embodiment of the present invention.

That is, FIG. 9 is a schematic block diagram for representing the fourth 256-QAM communication system 400 for quadrant symmetry mapping.

At a signal transmission side, as viewed in the left side of FIG. 9, 8 digital signal series are inputted into this system 400 via 8 input terminals 11-1 to 11-8. The 2 bits digital signals inputted from the two input terminals 11-1 and 11-2 are supplied to a differential encoder 45 so as to be differentially-encoded. The resultant 2 bits differentially-encoded signals are separately supplied to a first encoder 46 and a second encoder 47 having the same function as that of the first encoder 46, whereby 2 bits encoded digital signals are produced therefrom respectively. Another 2-bit digital signal combination inputted from the subsequent two input terminals 11-3 and 11-4 is furnished to a third encoder 48 so as to be encoded. Similarly, each of 2-bit digital signal combinations which are inputted from two input terminals 11-5 and 11-6, and also two input terminals 11-7 and 11-8 respectively, are supplied to fourth and fifth encoders 49 and 50 respectively for signal encoding purposes.

It should be noted that the codes employed in the first and second encoders 46 and 47 commonly connected to the differential encoder 45 are the same as each other, and therefore correspond to such error correcting codes having all 1 vectors as code words. Also, error correcting codes utilized in the third, fourth, and fifth encoders 48, 49 and 50 may be selected to be arbitrary, for instance, an error correcting code having an error correcting capability in accordance with a bit error rate of signal series.

Then, the 8 bits digital signals outputted from the first to fifth encoders 46, 47, 48, 49 and 50 are converted in a 256-QAM modulator 51 into signal waveforms corresponding to the signal points which have been mapped based upon quadrant symmetry mapping.

At a signal reception side of the fourth 256-QAM communication system 400, the 8 bits digital signals which have been demodulated in a 256-QAM demodulator 53, are error-corrected by first to fifth decoders 54, 55, 56, 57 and 58. The 2 bits decoded digital signals derived from the first and second decoders 54 and 55 are differential-decoded by a quadrature differential decoder 59 corresponding to the above-described quadrature differential decoder 54, so that 2 bit differentially-encoded signals are outputted from this quadrature differential decoder 59 to two output terminals 18-1 and 18-2, respectively. The remaining 2-bit decoded digital signal combinations are directly outputted from the third to fifth decoders 56 to 58 to other output terminals 18-3 to 18-8.

As a result, also in the fourth preferred embodiment, when the combinations of the signal series which has no relation to determine the quadrant of the phase plane are encoded, the coding operation can be done with each of the 2-input signal combinations. Consequently, the overall system can be made small, as compared with another system in which all of the signal series are independently encoded.

There is another particular advantage that since the redundancy of the error correcting codes can be determined based upon the bit error rate for the receptions of the respective signal series, the coding operations can be effectively executed with smaller redundancy.

Fifth QAM Communication System

Figure 10:
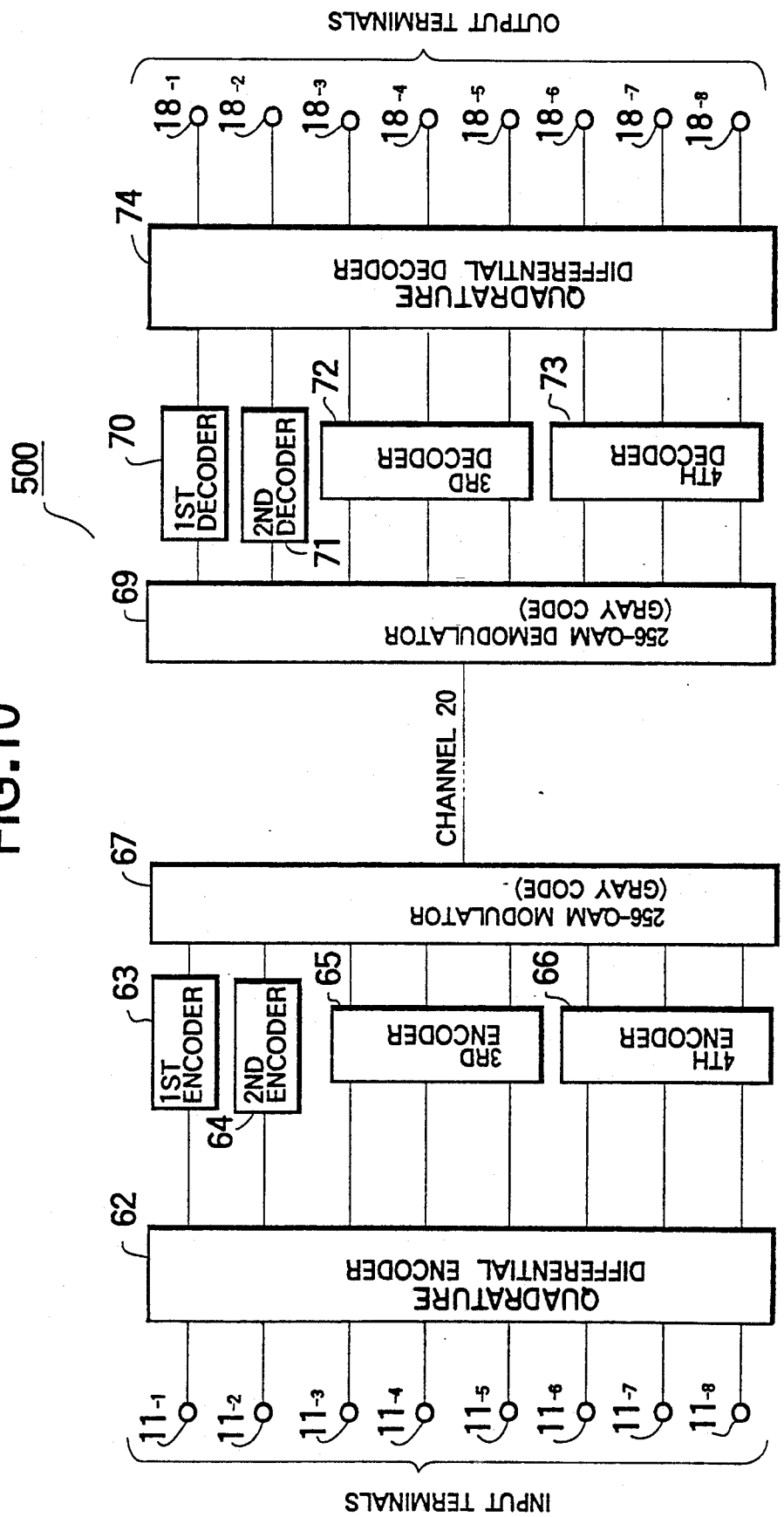
FIG. 10 is a schematic block diagram of a still further 256-QAM communication system 500 arranged by utilizing the second basic idea, according to a fifth preferred embodiment of the present invention.

In FIG. 10, there is shown a 256-QAM communication system 500 having the Gray code, according to a fifth preferred embodiment of the present invention. It should be noted that this fifth QAM communication system 500 similarly employs the second basic idea of the invention.

At a signal transmission side of the fifth 256-QAM communication system 500, 8 digital signal series are inputted from 8 input terminals 11-1 to 11-8, and supplied to a differential encoder 62. In the differential encoder 62, these input digital signals are differentially-encoded, and two encoded signal series $I_1$ and $Q_2$ are supplied to first and second encoders 63 and 64 having the same functions as each other for the encoding purposes. Three encoded signal series $I_2$, $I_3$ and $I_4$ are supplied to a third encoder 65 for encoding purposes. Similarly, three encoded signal series $Q_2$, $Q_3$ and $Q_4$ are encoded in a fourth encoder 66. It should be noted that the codes employed in the first and second encoders 63 and 64 are the same as each other, and correspond to an error correcting word having all 1 vectors as code words. Further, error correcting codes utilized in the third and fourth encoders 65 and 66 are the same as each other and are arbitrary codes. The 8 bits digital signals derived from the first to fourth encoders 63, 64, 65 and 66 are converted by a 256-QAM modulator 67 into waveforms corresponding to signal points which have been mapped based upon the above-described Gray code, and the Gray-coded digital signals are output therefrom to the signal transmission channel 20.

On the other hand, at a signal reception side of this 256-QAM communication system 500, the 8 bits digital signals which have been demodulated by a 256-QAM demodulator 69 are error-corrected by first to fourth decoders 70, 71, 72 and 73, and thereafter supplied to a differential decoder 74. Thus, these 8 bits digital signals derived from the first to fourth decoders 70 to 73 are differential-decoded. The resultant 8 bits differential-decoded digital signals are outputted from 8 output terminals 18-1 to 18-8, respectively.

When the combinations of the signal series $I_2$ through $Q_4$ which have no relation to determine the quadrant of the phase plane are encoded, since each of 3-input signal series $I_2$, $I_3$, $I_4$ and $Q_2$, $Q_3$, $Q_4$ can be encoded in the third and fourth encoders 65 and 66, the overall system 500 can be made small, as compared with another system in which all of the signal series are separately coded.

As previously described in detail, in accordance with the respective third to fifth QAM communication systems, when the combinations of the signal series having no relation to determine the quadrant of the phase plane are encoded, since a plurality of signal series are encoded, the entire circuit arrangement of the QAM communication system can be simply constructed, as compared with such a QAM communication system in which all of the input signal series are separately encoded.

Sixth QAM Communication System

Figure 11:
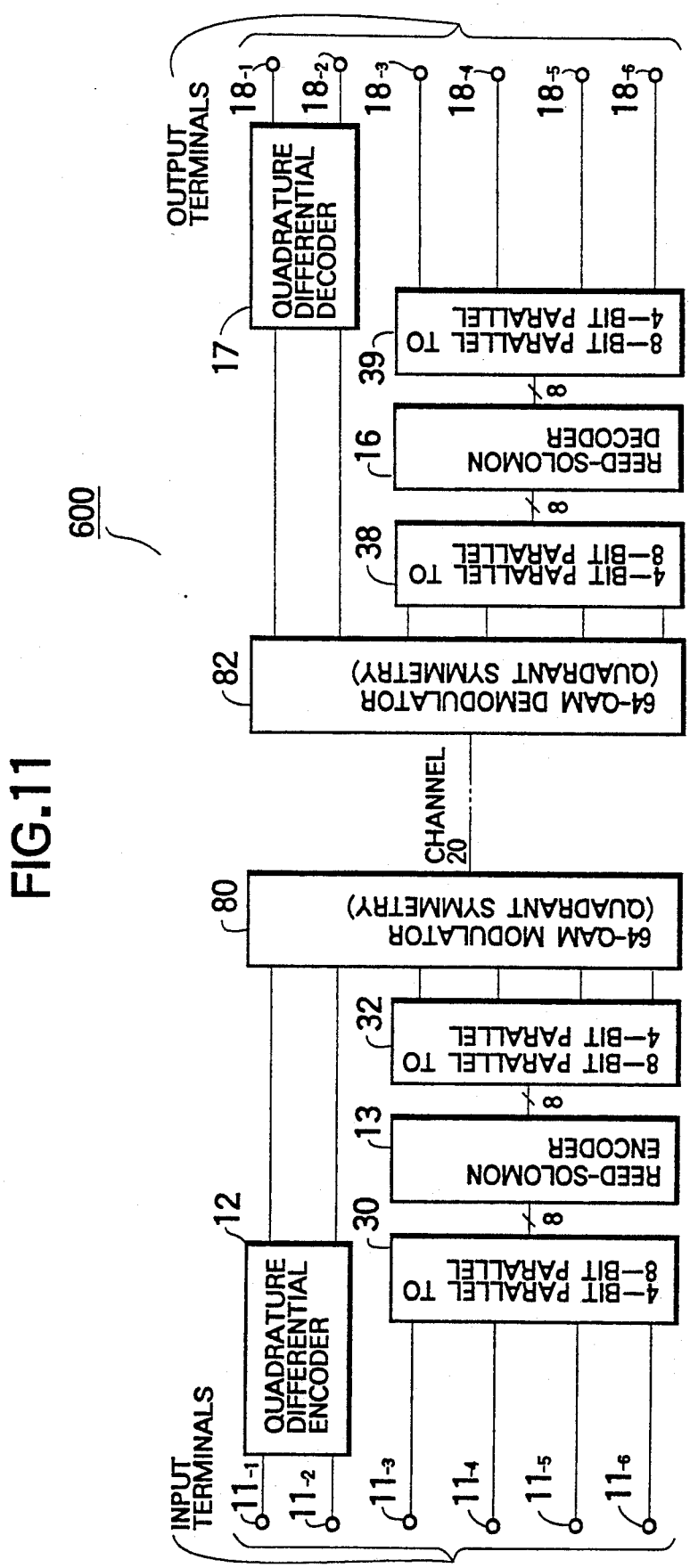
FIG. 11 is a schematic block diagram of a 64-QAM communication system 600 constructed by using the third basic idea, according to a sixth preferred embodiment of the present invention.

In FIG. 11 there is shown a 64 QAM communication system 600 employing the third basic idea, according to a sixth preferred embodiment of the present invention.

As is apparent from FIG. 11, a major error control circuit portion of the sixth QAM communication system 600 is substantially identical to that of the second QAM communication system 200. Accordingly, the same reference numerals shown in FIG. 4 will be employed as those for denoting the same or similar circuit elements in the following drawings, and no further explanation thereof will be made in the following descriptions.

That is, both a 64-QAM modulator 80 and 64-QAM demodulator 82 are newly employed in this sixth preferred embodiment.

An operation of the 64-QAM communication system 600 will now be described.

It should be noted that signal information of two signal series 11-1 and 11-2 outputted from the quadrature differential encoder 12 determine the quadrant of the signal phase plane in 64-QAM modulator 80. In the case of the quadrant symmetry mapping, 4 signal series 11-3 through 11-6 other than the above-described 2 signal series 11-1 and 11-2 receive no adverse influence of the signal phase rotation, so that an arbitrary code may be employed. When a GF ($2^8$) Reed-Solomon code is employed in these signal series, an error correcting method with a high coding rate of 99.0% may be utilized. In addition, the clock frequency of the error correcting circuits can be made half of the modulation frequency. This error correcting method shown in FIG.

11 enables the transparency to be established with respect to the signal phase rotation.

Further, if signal point mapping is the quadrant symmetry mapping, and the above-described two signal series 11-1 and 11-2 which are not encoded by the Reed-Solomon code are independently encoded by transparent error correcting codes, this modified QAM communication system may become a transparent error correcting system without receiving any adverse influence caused by the signal phase rotation.

Seventh QAM Communication System

FIG. 12 is a schematic block diagram of a 64-QAM communication system 700 according to a seventh preferred embodiment of the present invention, with employment of the first basic idea and the natural binary mapping method as shown in FIG. 14.

In the seventh 64-QAM communication system 700, there are newly provided 6 pairs of 1-bit serial data to 8-bit parallel data converters 84-A to 84-F and 86-A to 86-F, and also 6 pairs of 8-bit parallel data to 1-bit serial data converters 85-A to 85-F and 88-A to 88-F. The main feature of the seventh preferred embodiment is that all of 6 input digital signals supplied from the input terminals 11-1 to 11-6 are indenpendently processed with the Reed-Solomon encoders 83-1 to 83-6 and Reed-Solomon decoders 87-1 to 87-6. In the case of natural binary mapping, all Reed-Solomon codes should be transparent and indentical.

That is to say, when as shown in FIG. 12. the Reed-Solomon codes are applied to all of the signal series, an error correcting system capable of correcting a burst error can be achieved. When the above-described 2-symbol (255, 251) error correction Reed-Solomon code on GF ($2^8$) is employed as the Reed-Solomon code, there is a particular advantage that a single burst error having a burst length of less than 9 bits can be corrected. In addition, the clock frequency of error control encoders/decoders can be made as low as ⅛ times the modulation frequency.

As previously described in detail, in accordance with the respective third to seventh QAM communication systems, when the combinations of the signal series having no relation to determine the quadrant of the phase plane are encoded, since a plurality of signal series are encoded, the entire circuit arrangement of the QAM communication system can be simply constructed, as compared with such a QAM communication system in which all of the input signal series are separately encoded.

Eighth QAM Communication System

Furthermore, in accordance with the present invention, many modifications may be achieved other than the above-described first to seventh preferred embodiments 100 to 700 with employment of the first and second basic ideas.

For instance, in the case that the phase ambiguity of the reproduced carrier wave is removed by periodically transmitting the known signal patterns, there is no need to separately employ the error correction encoder/decoder (i.e., quadrature differential encoder/decoder) with respect to the I-axis and Q-axis, and "n" pieces of signal series for determining signal point mapping are considered as a symbol which will be coded as a Reed-Solomon code.

A 256-QAM communication system 800 utilizing the above-described idea, according to an eighth preferred embodiment of the present invention, will now be described with reference to FIG. 13. As is apparent from the circuit arrangement shown in FIG. 13, no quadrature differential encoder/decoder is employed in the eighth 256-QAM communication system 800. Instead of the quadrature differential encoder/decoder, a unique word adder 820 for producing the above-described known signal pattern is connected to the output terminal of the Read-Solomon encoder 810, and also a unique word detector 850 is connected to the input terminal of the Read-Solomon decoder 860.

After 8 series of 255 bits signal are transmitted, a unique word constructed of 1 symbol (8 bits) is transmitted from the unique word adder 820 in the eight 256-QAM communication system 800. The quadrant phase information is added to the Read-Solomon encoded input signals based upon this unique word, since the unique word has a function to correct phase shifts. Thus, the data to which the unique word has been added and which has been modulated in the 256-QAM modulator 830 and thereafter demodulated in the 256-QAM demodulator 840, no longer contains such phase ambiguity. Subsequently, the unique word is detected by the unique word detector 850 from this data so as to obtain absolute phases with respect to the input signals. As a result, the phase ambiguity has been eliminated from the resultant 8-bit data derived from the Reed-Solomon decoder 860 based upon the detected unique word.

There are the following advantages of the eighth 256-QAM communication system 800.

Figure 13:
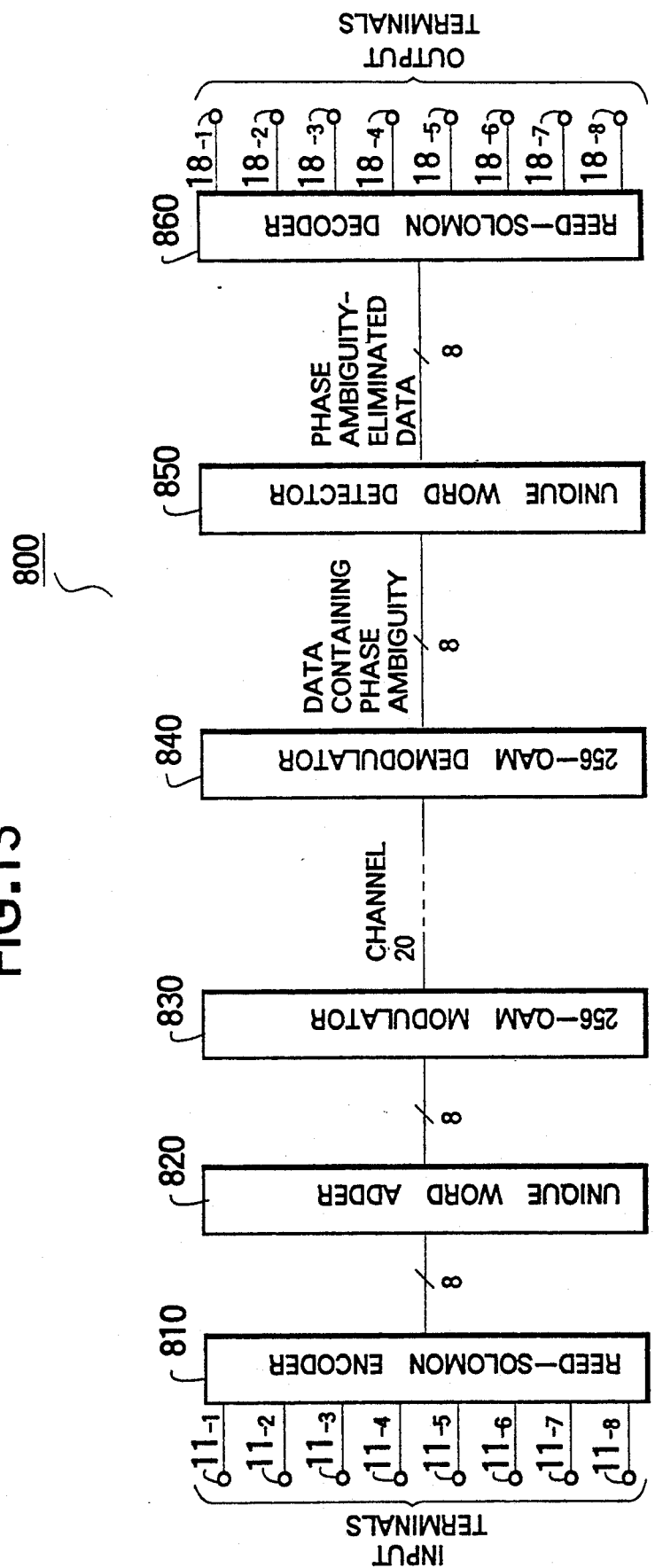
FIG. 13 is a schematic block diagram of another 256-QAM communication system 800 employing a unique word adder/detector and no quadracture differential encoder/decoder, according to an eighth preferred embodiment of the present invention.

In the case of the 256-QAM system shown in FIG. 13, since n=8, then a code of GF ($2^8$) having a length of 255 can be utilized. When a two-symbol correction code is employed similar to the above-described second preferred embodiment, the resultant coding rate can become 98.4%. However, the conventional binary BCH code to perform such a 2 error correction under the same delay time becomes a code (255,239) at a coding rate of 93.7%. As a consequence, the frequency utilization efficiency according to the present invention can be improved. Furthermore, although the total number of the respective encoders and decoders is 8 in case of the conventional binary BCH code, only 1 Read-Solomon and 1 Read-Solomon decoder are required in the eighth preferred embodiment. Consequently, there is another particular advantage that the scale of the entire circuit arrangement can be reduced.

As is apparent from the foregoing, the Reed-Solomon encoder 810 and decoder 860 may be provided inside the unique word adder 820 and detector 850. Furthermore, both the unique word adder and detector may be omitted from the eighth QAM communication system 800, and alternatively, the Reed-Solomon encoder/decoder may employ an absolute phase detecting function.

What is claimed is:

1. A multi-level QAM (quadrature amplitude modulation) communication system having signal processing path and utilizing an n bits ("n" being an integer) QAM signal having $2^n$ signal points, comprising:
   differential encoder/decoder means, located along said signal processing path, for differentially encoding/decoding n pieces of an input digital signal series to resolve phase ambiguity contained in a differentially encoded input signal series;
   error correction means including a Reed-Solomon encoder and a Reed-Solomon decoder, provided inside said differential encoder/decoder means along said signal processing path for said input digital signal series, for error-control-encoding/decoding n pieces of said differentially encoded input signal series by utilizing at least one of said digital signal series to correct errors by employment of Reed-Solomon codes; and QAM modulator/demodulator means, located along said signal processing path, for QAM-modulating/demodulating n pieces of error-control-encoded signals series so as to produce $2^n$ QAM signals.

2. A multi-level QAM (quadrature amplitude modulation) communication system as claimed in claim 1, wherein said error correction means separately performs encoding/decoding operations by employment of the same Reed-Solomon code with respect to two orthogonal channels (I;Q).

3. A multi-level QAM (quadrature amplitude modulation) communication system as claimed in claim 1, wherein said differential encoder/decoder means performs a differential coding operation under such a condition that a generator polynomial of a Reed-Solomon code is not divisible by $X-1$, said generator polynomial being given as $$G(X) = \prod_{i=r}^{d-2+r} (X - \alpha^i).$$

where "r" is an integer, "$\alpha$" is a primitive element of a Galois field, and "d" is the minimum distance of said Reed-Solomon code.

4. A multi-level QAM (quadrature amplitude modulation) communication system as claimed in claim 1, wherein a total number of said error correction means is smaller than a bit number of said QAM signal.

5. A multi-level QAM (quadrature amplitude modulation) communication system as claimed in claim 1, wherein said signal point mapping is natural binary mapping.

6. A multi-level QAM (quadrature amplitude modulation) communication system having a signal processing path and for producing an n bits ("n" being an integer) QAM signal having $2^n$ signal points from n pieces of an input digital signal series, comprising:

differential encoder/decoder means, located along said signal processing path, for differentially encoding/decoding at least two pieces of said input digital signal series for determining a quadrant of a phase plane for a signal point mapping among said n pieces of said input digital signal series so as to produce at least two pieces of differentially-encoded signal series;

first error correction means, provided inside said differential encoder-decoder means and located along said signal processing path for said input digital signal series, for error correction so as to produce at least two pieces of first error-control-encoded signal series;

second error correction means, located along said signal processing path, provided directly to receive remaining pieces of said input digital signal series so as to produce a second error-control-encoded signal series; and, QAM modulator/demodulator means, located along said signal processing path, for QAM-modulating/demodulating both said first error-control-encoded signal series and second error-control-encoded signal series so as to output said n bits QAM signal, whereby phase ambiguity contained in said differentially-encoded signal series is solved.

7. A multi-level QAM (quadrature amplitude modulation) communication system as claimed in claim 6, wherein said second error correction means is constructed of a plurality of error correction encoders and a plurality of error correction decoders.

8. A multi-level QAM (quadrature amplitude modulation) communication system as claimed in claim 6, wherein said second error correction means employs a nonbinary error correcting code.

9. A multi-level QAM (quadrature amplitude modulation) communication system as claimed in claim 6, wherein said signal point mapping is quadrant symmetry mapping.

10. A multi-level QAM (quadrature amplitude modulation) communication system as claimed in claim 6, wherein said signal point mapping is Gray code mapping.

11. A multi-level QAM (quadrature amplitude modulation) communication system as claimed in claim 6, wherein said differential encoder-decoder means performs a differential coding operation under such a condition that a generator polynomial of an error control code is not divisible by $X-1$, said generator polynomial being given as $G(X) = LCM \{m_T(X), M_{T+1}(X), \ldots, M_{d-2+r}(X)\}$, where LCM indicates the least common multiple, "r" is an integer, $M_T(X)$ is the minimum function of $\alpha_1$, "$\alpha$" is a primitive element of a Galois field, and "d" is the minimum distance of the error control code.

12. A multi-level QAM (quadrature amplitude modulation) communication system as claimed in claim 6, wherein a total number of said first and second error correction means is smaller than a bit number of said QAM signal.

13. A multi-level QAM communication system as claimed in claim 6, wherein said first error correction means includes:

two sets of error correction code encoders/decoders each for encoding and decoding one differentially-coded signal series derived from said differential encoder/decoder means so as to finally produce said first error-control-coded series, each of said error correction codes being the same code.

14. A multi-level QAM (quadrature amplitude modulation) communication system having signal processing path and for producing $2^n$ pieces of n-bit ("n" being an integer) QAM signal points from n pieces of an input signal series comprising:

encoder/decoder means, located along said signal processing path utilizing a Reed-Solomon code of a Galois field GF ($2^l$), for error-correction-encoding/decoding h pieces of an input signal series ("h" being a positive integer smaller than or equal to "n" and "l" being larger than or equal to "h"); and QAM-modulating/demodulating mans positioned inside said encoder/decoder means along said signal processing path for said n pieces of input signal series, for QAM-modulating/demodulating said n pieces of input signal series containing h pieces of Reed-Solomon encoded input signal series so as to resolve phase ambiguity contained in said h pieces of Reed-Solomon encoded input signal series.

15. A multi-level QAM (quadrature amplitude modulation) communication system as claimed in claim 14, wherein said "l" is equal to A×h, where "A" is a positive integer.

16. A multi-level QAM (quadrature amplitude modulation) communication system as claimed in claim 14, further comprising:

unique word adding means, located along said signal processing path, for adding a unique word representative of quadrant phase information of said input signal series to said h pieces of Reed-Solomon encoded input signal series; and unique word detecting means, located along said signal processing path, for detecting said unique word contained in said h pieces of Reed-Solomon encoded input signal series in order to obtain absolute phases with respect to said input signal series.

* * * * *